United States Patent [19]

Miyagawa et al.

[11] Patent Number: 5,458,254
[45] Date of Patent: Oct. 17, 1995

[54] METHOD FOR MANUFACTURING LIQUID JET RECORDING HEAD

[75] Inventors: Masashi Miyagawa; Norio Ohkuma, both of Yokohama; Hiroaki Toshima, Tokyo, all of Japan

[73] Assignee: Canon Kabushiki Kaisha, Tokyo, Japan

[21] Appl. No.: 364,020

[22] Filed: Dec. 27, 1994

Related U.S. Application Data

[63] Continuation of Ser. No. 194,810, Feb. 14, 1994, abandoned, which is a continuation of Ser. No. 70,842, Jun. 3, 1993, abandoned.

[30] Foreign Application Priority Data

Jun. 4, 1992 [JP] Japan .................................... 4-144502

[51] Int. Cl.⁶ ............................. B44C 1/22; G01D 15/00; B29C 37/00
[52] U.S. Cl. ................... 216/27; 216/644; 216/655; 216/659.1; 216/668; 216/41; 216/67
[58] Field of Search .................... 216/27, 39, 41, 216/67; 346/140.1

[56] References Cited

U.S. PATENT DOCUMENTS

| | | | |
|---|---|---|---|
| 4,313,124 | 1/1982 | Hara | 346/140 R |
| 4,345,262 | 8/1982 | Shirato et al. | 346/140 R |
| 4,459,600 | 7/1984 | Sato et al. | 346/140 R |
| 4,463,359 | 7/1984 | Ayata et al. | 346/1.1 |
| 4,558,333 | 12/1985 | Sugitani et al. | 346/140 R |
| 4,608,577 | 8/1986 | Hori | 346/140 R |
| 4,723,129 | 2/1988 | Endo et al. | 346/1.1 |
| 4,740,796 | 4/1988 | Endo et al. | 346/1.1 |
| 5,126,768 | 6/1992 | Nozawa et al. | 156/668 X |

FOREIGN PATENT DOCUMENTS

| | | |
|---|---|---|
| 0432795 | 6/1991 | European Pat. Off. . |
| 54-56870 | 5/1979 | Japan . |
| 57-208256 | 12/1982 | Japan . |
| 57-208255 | 12/1982 | Japan . |
| 59-123670 | 7/1984 | Japan . |
| 59-138461 | 8/1984 | Japan . |
| 60-71260 | 4/1985 | Japan . |
| 61-154947 | 7/1986 | Japan . |

OTHER PUBLICATIONS

Patent Abstracts of Japan, vol. 012, No. 131 (M–688) Apr. 22, 1988 & JP-A-62 253 457 (Canon Inc) Nov. 5, 1987.

C. Johnson and R. R. Wilbarg, "Fabricating Capillaries and Nozzles for Ink Jet Printing" IBM Technical Disclosure Bulletin, vol. 23 No. 5 pp. 1870–1871 Oct., 1980.

"Mini gears show their mettle", Design Engineering, Jun. 1991 London, GB, p. 24, XP 222510.

*Primary Examiner*—William Powell
*Attorney, Agent, or Firm*—Fitzpatrick, Cella, Harper & Scinto

[57] ABSTRACT

A method for manufacturing a liquid jet recording head includes a first process of forming an ink flow passage pattern on a substrate by a resin layer; a second process of forming a covering resin layer to cover a resin layer on the resin layer; a third process of forming an ink discharging port pattern by a material having resistance to an oxygen plasma on the surface of the covering resin layer; a fourth process of forming ink discharging ports by dry etching the resin layer by the application of the oxygen plasma with the ink discharging port pattern as a mask; and a fifth process of eluting the resin layer. This method enables the ink discharging ports to be formed without cutting the substrate and at the same time, the distance between the ink discharging pressure generating elements and the orifices to be controlled rigidly; hence making it possible to manufacture a liquid jet recording head having a stabilized discharging characteristic.

12 Claims, 4 Drawing Sheets

METHOD FOR MANUFACTURING LIQUID JET RECORDING HEAD

This application is a continuation of application Ser. No. 08/194,810 filed Feb. 14, 1994, now abandoned, which is a continuation of application Ser. No. 08/070,842 filed Jun. 3, 1993, now abandoned.

BACKGROUND OF THE INVENTION

1. Field of the Invention

The present invention relates to a method for manufacturing a liquid jet recording head for generating the recording droplets used for an ink jet recording method.

2. Related Background Art

A liquid jet recording head applicable to an ink jet recording method (liquid jet recording method) is generally provided with fine recording liquid discharging ports (synonymous with "orifices"), liquid flow passages, and the liquid discharging energy generating portions which are arranged on a part of each of the foregoing liquid flow passages. As the method for manufacturing a liquid jet recording head such as this, there has hitherto been known a method wherein a glass or metallic plate is used, for example, and subsequent to the formation of fine grooves on such plate by means of cutting, etching, or other machining, the plate on which the grooves are formed is joined to the other appropriate plate for the formation of the liquid flow passages.

However, the liquid jet recording head manufactured by a conventional method of the kind tends to result in the inner wall surfaces of the liquid flow passages having an undesirable roughness, or in the deformation of the liquid flow passages due to the difference in the etching ratio. Thus, it is difficult to obtain the liquid flow passages having a constant resistance in them, leading to a problem that the recording characteristics of the liquid jet recording heads tend to vary after the manufacture. Also, in cutting, the plate is easily broken or is apt to crack; thus resulting in an undesirable manufacturing yield. Also, in etching, the number of processes is many so that there is a disadvantage that the cost of manufacturer is increased. Furthermore, in the conventional method as described above, when it is needed to precisely bond the grooved plate for the formation of the liquid flow passages and the covering plate for the provision of the driving elements such as piezoelectric elements or electrothermal transducers to generate the energy for discharging the recording droplets, there is a difficulty in positioning them as a common drawback. Hence, a problem is inevitably encountered that the conventional method lacks in the mass productivity.

Also, the liquid jet recording head is always in contact with a recording solution (usually, an ink liquid which is mainly composed of water and is not neutral in most cases, an ink liquid which is mainly composed of an organic solvent, or the like) when the head is in use. As a result, the material to construct a head for the liquid jet recording should desirably be the one which is not easily affected by the recording solution in keeping its strength. Also, on the contrary, the material should not create any harmful component which may be mixed in the recording solution to reduce its capability as a recording liquid. In the above-mentioned conventional method, there is a limit due to the method of machining, and it is difficult to select a material which meets these requirements perfectly after all.

In order to solve the problems, there has been designed a method as disclosed in Japanese Laid-Open Patent Application Nos. 57-208255 and 57-208256 wherein the nozzles comprising ink flow passages and orifice portions are patterned on the photosensitive resin substrate on which the ink discharging pressure generating elements are formed, and then, a glass plate ceiling or the like is joined onto this substrate.

Nevertheless, this method has the problems given below.

(1) A bonding material for the adhesive bonding of the ceiling plate drops and flows into the ink flow passages to deform shapes of the flow passages.

(2) In cutting the foregoing substrate to form the ink discharging ports, the cut particles enter the ink flow passages, resulting in the unstable ink discharge.

(3) Since the substrate having the hollow portion where the ink flow passages are formed is cut, the ink discharging ports are partially cut off when formed by cutting.

Because of these problems, the manufacturing throughput of the liquid jet recording head is not only reduced, but also it is difficult to manufacture a liquid jet recording head having a finer structure of the ink flow passages or a more number of ink discharging ports for an elongated head.

As a method to avoid these problems, it is possible to cite an invention disclosed in Japanese Laid-Open Patent Application No. 61-154947. This invention is such that the ink flow passages are formed by a soluble resin, and the pattern thus formed is covered with an epoxy resin and hardened, and then, after the substrate is cut, the soluble resin pattern is removed by elution.

On the other hand, with the progress in the recording technology in recent years, a higher precision is increasingly demanded, and in the industrial field of the liquid jet recording, the reduction of the orifice area is being attempted as a method to meet such a demand. In other words, there is a need for a machining technique to produce finer orifices.

Here, according to the methods disclosed in the foregoing Japanese Laid-Open Patent Application No. 57-208255, Japanese Laid-Open Patent Application No. 57-208256, and Japanese Laid-Open Patent Application No. 61-154947, respectively, it is equally required to cut the ink flow passages to form the ink discharging ports. Thus, the distance between the ink discharging pressure generating elements and the discharging ports depends on the precision with which to cut the ink flow passages. In the meantime, it is generally practiced that the cutting is performed by a dicing saw or the like mechanical means. It is difficult to implement a high precision cutting. Also, in cutting, a cut off may occur for the substrate, and there are some cases where a curved ink discharging results, making it difficult to implement a desirable printing.

On the other hand, the irradiation of a laser light is used for machining in the method wherein the ink discharging ports are opened on a plate or the like, and then, such plate is joined to the end of the ink flow passages to form a recording head. However, in the laser machining, the opening is formed with a taper. As a result, depending on the direction of the taper (wider or narrower toward the outside when observed from the ink flow passage side), there may occur an unstable state of the ink discharge.

SUMMARY OF THE INVENTION

The present invention is designed in consideration of the above-mentioned various problems. It is an object of the invention to provide a method of manufacture which enables the productivity to be improved for an inexpensive, precise, reliable liquid jet recording head having a high resolution (with nozzles assembled in a high density).

It is another object of the present invention to provide a new method for manufacturing a liquid jet recording head capable of supplying a liquid jet recording head having a structure in which the liquid passages are formed precisely and accurately and machined finely in an excellent throughput.

It is still another object to provide a new method for manufacturing a liquid jet recording head capable of supplying a liquid jet recording head which produces a lesser effect on the recording solution correlatively and has an excellent mechanical strength as well as an excellent chemical tolerance.

In order to achieve the above-mentioned objects, a method for manufacturing a liquid jet recording head according to the present invention comprises the following process of:

forming ink flow passages made of a soluble resin on a substrate;

forming a covering resin layer on the aforesaid resin layer;

patterning ink discharging ports with a material having a high resistance to an oxygen plasma on the aforesaid covering resin layer;

forming ink discharging ports on the covering resin layer by the application of an oxygen plasma with the aforesaid ink discharging port pattern as a mask; and lastly, eluting the soluble resin layer.

For the covering resin, it is preferable to use a high-molecular compound which is obtainable at least by copolymerizing glycidyl methacrylate.

Further, according to the present invention, a photosensitive resin of an ionizing radiation decomposing type is used as the aforesaid soluble resin.

In the manufacture of a liquid jet recording head according to the present invention, there is an advantage that it is extremely ease to implement the establishment of the most important factor which affects the characteristics of the liquid jet recording head, that is, the distance between the discharging energy generating elements and the orifices, and the positional precision between each of the aforesaid elements and the center of the orifices. In other words, according to the present invention, it is possible to set the distance between the discharging energy generating elements and orifices by controlling the coating film thickness of the soluble resin layer, the covering resin layer, and the layer of the high plasma resistance, with which to form the ink flow passages, while it is possible to rigidly control the coating film thickness with a good reproducibility by the application of the thin film coating technique conventionally in use. Also, the discharging energy generating elements and the orifices can be optically positioned by the application of the photolithographing technique. Compared to the conventional method for adhesively bonding the orifice plate, therefore, the positional precision between the discharging energy generating elements and the ink discharging ports can be enhanced remarkably.

With the provision of a method for manufacturing a liquid jet recording head having a higher dimensional precision, it is possible to manufacture the liquid jet recording head which is capable of recording in a higher resolution with a more stable discharge of recording droplets.

According to the present invention, the distance between the liquid discharging pressure generating elements and the ink discharging ports is rigidly controlled while this distance is a major factor to vary the characteristics of the liquid jet recording head as described above. Therefore, the present invention should preferably be applicable to the method for manufacturing a liquid jet recording head which discharges ink droplets in the direction perpendicular to the substrate (hereinafter, referred to as side type head for convenience).

In manufacturing a side type head, the most important point is the formation of ink discharging ports. For the formation of the aforesaid ink discharging ports, it is possible to cite a method wherein a photosensitive resin is used for the covering resin, and then, the photographing technique is applied. However, if a negative type sensitive material is used for the covering resin, there are some cases where the resultant resolution is not sufficient or the discharging ports are reversely tapered, that is, more widely open toward the outside, resulting in an undesirable characteristics of the discharging ports. Moreover, there occurs a disadvantage that a scum or the like appears after the development. In most cases, therefore, it is difficult to manufacture a liquid jet recording head having excellent characteristics. If a positive type sensitive material is used for the purpose, a sufficient mechanical strength cannot be obtained. Consequently, this type cannot be employed, either.

Further, a structural material for the liquid jet recording head must be resistive enough to ink, heat, and others among various requirements for its characteristics. Therefore, it is extremely difficult for the structural material to dually have the characteristics such as resolution and sensitivity required for a photosensitive resin.

In order to solve this difficulty, various methods for the formation of the discharging ports are studied and examined. As a result, it is found that the plasma etching process will result in an excellent resolution and the formation of the discharging ports without any tapering as well. Of the plasma etching, however, the fluoric plasma process and the chloric plasma process etch the etching mask, too, when applied to etching the thick film material. Accordingly, these processes are not suitable for the formation of the discharging ports of an ink jet head. In contrast, the oxygen plasma process etches the resin at a high speed, and if a metal, silicon oxide, or the like is used as the mask material, the mask is not damaged even when a thick film is processed. Hence, this plasma process is suitable for the formation of the discharging port of an ink jet head.

Now, the oxygen plasma process is used for patterning the mask layer in the semiconductor device fabrication process in order to produce an $SiO_2$ substrate. In the semiconductor technology, the thickness of the mask layer is as thin as 1 to 2 μm, and it is possible to execute an oxygen plasma process precise mask pattern. However, in forming the ink jet discharging ports for an ink jet head, the resin layer needs a thickness of 10 to 30 μm approximately. Thus, if the semiconductor device formation process is applied to it without any modification, it may take 60 to 90 minutes approximately to obtain that much of the thickness.

Also, in order to shorten the processing time, the oxygen plasma may be densified for the required formation. Then, although the processing time can be shortened to less than 10 minutes, a heat of 100° to 120° C. is generated. It is, therefore, necessary for the material used for forming the ink flow passages or for forming the discharging ports in manufacturing an ink jet head to have an excellent resistance to heat. (The ink flow passage formation resin should preferably have a glass transition point at 120° C. or more, and the discharging port formation resin, at 150° C. or more).

In addition, since the ink flow passage formation resin is formed on the substrate where an ink supply inlet is opened, it is not desirable that the resin drips into the inlet opening. A high coating capability is required. Moreover, after the formation of the discharging ports by the oxygen plasma process, the resin must be eluted for removal. Thus, a high dissolution is also required for such resin.

Fundamentally, the oxygen plasma can etch most of the high-molecular compounds, and this plasma allows the coating resin which serves as a main structural material for the liquid jet recording head to be selected in terms of a high resistance to ink and heat as well as the mechanical strength. Also, with the oxygen plasma, it is impossible to etch a metal or a metal oxide film in most cases. If the mask pattern is formed for the ink discharging ports by a material of the kind, it is possible to etch the coating resin layer of a thick film in an extremely high precision. Means for processing these metal and metal oxide film finely in an extremely high precision has already been in practice as means for manufacturing semiconductor devices.

In the present invention, the ink discharging ports are formed on the coating resin by a silicon resist as a material having a high resistance to the oxygen plasma. Then, with this pattern as a mask, the ink discharging ports are formed by the oxygen plasma; making it possible to form extremely fine ink discharging ports, and at the same time, to widen the range of the material selection in order to obtain a structural material which meets the requirements such as a high mechanical strength, resistance to heat and ink, adhesiveness to the substrate because there is no need of photosensitivity for the coating resin itself. Since the silicon resist is scarcely etched by the oxygen plasma, it is possible to implement the resistance to the intended etching only by coating this resist in an extremely small film thickness. A high resolution and sensitivity can be obtained accordingly. Further, the silicon resist does not have any affinity to ink. No ink droplets adhere to the vicinity of the ink discharging ports. It is, therefore, possible to obtain an effect that the ink droplets are stabilized and discharged straightly among some others.

As described above, in the method for manufacturing this liquid jet recording head, any high-molecular compounds may be used as the coating resin, but it is possible to attain the manufacture of a more capable liquid jet recording head stably by the use of the high-molecular compound obtainable by copolymerizing a glycizil methacrylate according to the present invention.

The coating resin should be hardened at a low temperature and have a high resistance to heat as described above. It is more preferable for such resin to have the characteristic that it can be etched rapidly by the oxygen plasma among others. As a method for forming a dissolvable resin layer for the formation of the ink flow passage pattern, it is desirable to use a photolithography utilizing a positive type photoresist and others. Also, the aforesaid film should desirably be placed stably over the through holes for ink supply inlet and the like. As a method for forming a resist pattern such as this, it may be possible to cite the one in which a dry film is adopted as the resist film, which is transferred by lamination onto the substrate where the ink supply inlet is formed, and then, the pattern exposure is provided.

The dry film should be thermally softened at a temperature of approximately 50° to 120° C. It should also demonstrate an adhesion to the substrate. On the other hand, the coating resin to cover the ink flow passage pattern should desirably be a heat setting resin from the viewpoint of the adhesion to the substrate, resistance to heat and ink. However, since a heat setting resin generally needs a temperature of approximately 150° C. to harden it. Therefore, if such temperature is given, there is a possibility that the resist film for the formation of the ink flow passages drips at the aforesaid temperature. This is a problem.

In order to avoid this problem, it is necessary to select a heat setting resin which can be hardened at a comparatively low temperature. As a low-temperature setting resin, there is named an epoxy resin which can be bridged by an ion reaction, but the etching speed of the oxygen plasma for the epoxy resin is extremely slow so that the productivity of the liquid jet recording head is inevitably lowered.

Therefore, the present inventor et al have ardently studied every possibility for the solution of this problem and found that as a coating resin serving as a material for the nozzle formation, an epoxy resin, phenol resin, unsaturated polyester resin, urea resin, melamine resin, diallyl phthalate resin, and some other thermo setting resins have a high resistance to heat, and with any one of them, a high speed etching is executable. Having a desirable mechanical strength, these are also preferably usable.

Particularly, the epoxy resin and diallyl phthalate resin are preferable because these have a high resistance to an ink having an alkaline property and a high adhesiveness to the substrate.

As the epoxy resin, there can be named a bisphenol A epoxy resin, bisphenol F epoxy resin, water added bisphenol A epoxy resin, bromic bisphenol A resin, novolac epoxy resin, cresol novolac epoxy resin.

Also, as a diallyl phthalate resin, ortho diallylphthalate resin, iso diallylphthalate resin can be named.

These thermo setting resins are hardened for use by the application of a generally used hardening agent such a peroxide, amine, anhydride, Lewis acid, or the like.

Also, it is preferable to use a methacrylate having epoxy group which can be produced by copolymerizing a glycidyl methacrylate and a vinyl monomer. In general, it is possible to synthesize this compound by copolymerizing a methacryl acid and the alkyl ester of the methacryl acid. There is no problem of course in copolymerizing an alkaline monomer, a styrene monomer, or the like, other than the methacryl monomer. As the alkyl ester of the methacryl acid, there can be named a methyl methacrylate, ethylmethacrylate, butyl methacrylate, propylmethacrylate, and as the acrylic acid alkyl ester, there can be named a methylacrylate, ethylacrylate, propylacrylate, butylacrylate, and the like. Furthermore, it may be possible to use a styrene, α-methylstyrene, and halogenide and alkylated substance of these monomers, isobutylene, maleic anhydride, and the like.

For the copolymerization ratio of these monomers, there is no problem in using any ratio, but it is more preferable to confine the copolymerization ratio of the glycidyl methacrylate within a range of 10 to 50 mol %. If the copolymerization ratio of the glycidyl methacrylate is less than 10 mol %, its resistance to heat is low, and there are some cases that a problem of crack generation may take place if it dips into the solvent or the like. Also, if the ratio exceeds 50 mol % for the copolymerization, the setting contraction of the coating resin becomes too abrupt, causing the film to be easily peeled off. The copolymerization ratio can be determined by measuring the strength of the epoxy group under a nuclear magnetic resonance (NMR) method or an infrared absorption (IR) method.

These high-molecular compounds produced by copolymerizing the glycidyl methacrylate do not have any aromatic ring in its molecular structure unlike the versatile epoxy compound (bisphenol A epoxy resin, and the like). Therefore, the etching can be executed at a higher speed. Also, the etching speed for the methacryl resin is particularly fast, which contributes to increasing the productivity of the liquid jet recording head. In this respect, the high-molecular compounds having the aromatic ring in its molecular structure are preferable from the viewpoint of its resistance to ink. Such compounds are also usable if only the problem of the resistance to heat can be solved for them in relation to the oxygen plasma process.

The foregoing covering resin can be hardened by the application of an amine, acidic anhydride, catalistic setting agent (such as Lewis acid), and sulfur compound. Particularly, the setting reaction by the amine, Lewis acid, onium salt, or the like is executable at a low temperature, and at the same time, the setting reaction by the onium salt makes a photosetting possible. Therefore, with them, it is possible to prevent the ink supply inlet from subsiding in patterning the ink flow passages as described earlier.

As the amine compounds, there can be named aliphatic amine compounds such as a diethylene triamine, triethylene tetramine, diethyl amino propylamine, isophorone diamine, and aromatic amines such as phenylene diamine, xylene diamine, diamino diphenyl methane, 4,4'-diamino diphenyl methane. Also, as the Lewis acid, there can be named a boron trifluoride—amine complex, adipic tridihydrazide, benzyl dimethyl amine, or the like. As the onium salt, there can be named a diphenyl ionium salt such as a diphenyl iodinium hexafluoro ionium, diphenyl iodinium hexafluoro ionium phosphate, ditert-butyl phenylhexafluoro ammonate, and SP-170 or the like manufactured by Adeka Inc., although its composition is not known. These setting agents should preferably be added to the high-molecular compound within a range of 0.01 wt % to 5 wt %.

As the dissolvable photosensitive resin used for the formation of ink flow passages according to the present invention, it is preferable to adopt an ionizing radiation decomposable photosensitive resin which will become a low-molecular compound when a high-molecular compound is dissolved by the irradiation of the ionizing radiation. In the present invention, the ionizing radiation decomposable photosensitive resin is applied to the portion where the ink flow passages are formed. After the coating resin layer is formed, the aforesaid photosensitive resin is dissolved into the low-molecules by the irradiation of the ionizing radiation. As a result, it is possible to perform cleaning in the last process in a short period of time with an extreme ease. This is a great advantage when finer orifices are produced. Further, the ionizing radiation decomposable photosensitive resin serves as a strong film as a high-molecular compound unless irradiated by the ionizing radiation. With this property, it is possible to form by lamination a film on the substrate having the ink supply inlet. (With the photosensitive resin whose film capability is low such as a phenol novolac resin which is widely used in general, it is impossible to form a film on the ink supply inlet).

A photosensitive resin of an ionizing radiation decomposable type should be a high-molecular component having 10,000 or more, or preferably 300,000 or more molecules, the bondage of which is cut by the irradiation of an ionizing radiation (UV light, Deep-UV light, electron rays, X rays, or the like), and which is made into low-molecules to change its dissolving speeds (faster). Hence, it is possible to perform patterning (positive type resist). As an ionizing radiation decomposable photosensitive resin such as this, there can be named a high-molecular compound of polyvinyl ketone including a structural unit represented by a general formula (1):

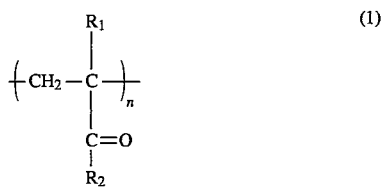

(where $R_1$ represents is a hydrogen atom and an alkyl group, and $R_2$, an alkyl group, replaced and non-replaced aromatic rings, and heterocyclic ring in the formula.)

More particularly, a polymethyl isopropenyl ketone, polymethyl vinyl ketone, polyphenyl ketone, polyisopropenyl t-butylketone or the like can be named.

Also, the polymethacrylate compound including the structural unit of a general formula (2) given below is useful.

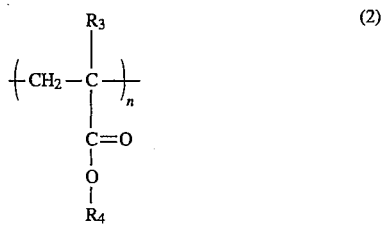

(where $R_3$ represnets an alkyl group and halogen atom, and $R_4$, an alkyl group, replaced and non-replaced aromatic ring, and heterocyclic ring in the formula.)

More specifically, a polymethyl methacrylate, poly n-butyl methacrylate, poly t-butyl methacrylate, polyphenyl methacrylate, polyhexafluoro butyl methacrylate, polymethacryl acid or the like can be named.

Also, the compounds of polymethacryl amide, polymethacrylonitrile, poly-α-methylstyrene, and the like can be used.

Further, a polysulfone, polybutene-1-sulfone, polymethylpenten-1-sulfone, polystylene-sulfone or the like can be used.

These above-mentioned compounds can be used by appropriately copolymerizing them as a matter of course. For example, a copolymer of the methyl methacrylate and methacryl acid, that of the glycidyl methacrylate, 3-oxy-imino-2-butanone methacrylate, phenylisopropenyl ketone, and the like are useful.

Moreover, there is no problem in using a sensitizing agent such as a benzophenone, 3,4-dimethoxy benzoic acid or the like together with the above-mentioned compounds.

These above-mentioned compounds are appropriately used in accordance with the characteristic required (patterning characteristics required for a thick film, resistance to heat, dissolution, sensitivity, and the like).

FIG. 1 to FIG. 6 are views schematically showing the fundamental embodiment according to the present invention. In each of the FIGS. 1 to 6, the structure of a liquid jet recording head according to the present invention and an example of the procedures required for manufacturing such a head are represented. In this respect, according to the present embodiment, a liquid jet recording head having two orifices is described, but the same is of course applicable to the case of a high density multi-array liquid jet recording head having more orifices than those mentioned therein.

At first, in the present embodiment, a substrate 1 made of a glass, ceramics, plastic, or metal is used as shown in FIG. 1, for example.

A substrate 1 such as this functions as a part of the structural member for the liquid flow passages, and is usable without any particular limit to its configuration, material, and the like if only the substrate is functional as a supporting member for a material layer on which to form the ink flow passages and ink discharging ports which will be described later. On the above-mentioned substrate 1, a desired number of the liquid discharging energy generating elements 2 such as electrothermal transducers or piezoelectric elements is arranged (in FIG. 1, two are represented). By means of the liquid discharging energy generating elements 2, a discharging energy is given to a recording liquid for discharging recording droplets for recording. Here, for example, when electrothermal transducers are used as the above-mentioned liquid discharging energy generating element 2, the transducers heat the recording liquid present in the vicinity thereof for generating the discharging energy. Also, if, for example, the piezoelectric elements are used, these elements generate the discharging energy by the mechanical vibration thereof.

In this respect, the electrodes (not shown) for inputting control signals for driving these elements are connected to the elements 2. Also, in general, for the purpose of improving the durability of these discharging energy generating elements, various functional layers are provided including a protective layer. There is no problem at all in providing such functional layers for the present invention as a matter of course.

In FIG. 1, an opening 3 is provided in advance on the substrate for supplying ink, and the mode in which the ink is supplied from the rear of the substrate is exemplified. Through this ink supply inlet, the ink is being supplied from an ink tank or ink supplying member arranged in the reverse side of the substrate to the liquid discharging energy generating element 2. In forming the aforesaid opening, any method is applicable if only such a method is mean capable of forming a hole on the substrate. For example, a drilling, ultrasonic process, or any other machining means can be employed, or it may be possible to use an optical energy such as a laser. Also, it may be possible to form a resist pattern or the like on the substrate for a chemical etching for the purpose. Moreover, the liquid discharging energy generating element and control signal electrodes can be manufactured by the application of a vacuum film deposition method and photolithography technique which are used in the fabrication of semiconductor devices, liquid crystal elements, and the like.

It is of course possible to form the ink supply inlet in the resin pattern without any formation thereof on the substrate, and then, provide it on the same surface as the ink discharging ports with respect to the substrate.

Now, on the substrate 1 which includes the above-mentioned liquid discharging energy generating elements 2, an ink flow passage pattern 4 is formed by a dissolvable resin as shown in FIG. 2. As means which is used most widely, a means to form the passages by a photosensitive material can be named, but it is possible to form it by means of a screen printing or the like.

When an ionizing radiation decomposable photosensitive resin is used as the dissolvable resin, the ink flow passage pattern 4 is formed on the substrate 1 including the above-mentioned liquid discharging energy generating elements 2 with the ionizing radiation decomposable resin layer. As a method for forming the ionizing radiation decomposable resin layer, a photosensitive resin is dissolved by a solvent and is coated once on a PET film or some other film, and then, after being dried, it is transferred onto the substrate by a laminator. This method is most preferable. As described earlier, the ionizing radiation decomposable photosensitive resin is a high-molecular component having 10,000 or more molecules, and has a high film capability. Therefore, a film can be formed on the ink supply inlet 3. Also, there is no problem in arranging a filler for the ink supply inlet 3, which can be removed in the post process, so that an usual spin coating method or roll coating method is employed in order to form the film.

If the ink supply inlet is formed as a through hole on the substrate shown in FIG. 1, it is necessary to arrange a structure so that a dissolvable material layer exists on the through hole, too. Therefore, a dry film should desirably be used. If the ink supply is not in such a mode as this, there is no problem in applying a photosensitive materials of a solvent type as a matter of course. The aforesaid photosensitive material must be capable of removing the formed pattern easily when an elution is applied.

When a photosensitive material is used, it is possible to adopt a material of a variable dissolution type if the material is a positive resist or negative resist in order to make the ink flow passage pattern dissolvable.

As the positive resist, there can be used a positive resist produced by mixing an alkali dissolvable resin (novolac resin, polyhydroxystyrene) and a conductive quinone diazid or naphthoquinone diazid, or an optically decomposable positive resist such as an ionizing radiation decomposable photosensitive resin using electron rays, Deep-UV, X rays, or the like. As the optically decomposable resin, high-molecular compounds of a polymethyl isopropenyl ketone, polyvinyl ketone or the like, methacryl high-molecular compounds of a polymethacryl acid, polymethacrylate, polyethyl methacrylate, poly n-butyl methacrylate, polyphenyl methacrylate, polymethacryl amide, poly-methacrylonitrile, or the like, or olefin sulfone high-molecular compounds such as polybutene-1-sulfone, polymethylpentene-1-sulfone, or the like.

The negative resist of a variable dissolution type is a resist of such a type that the polarity of the high-molecular side chains are changed by the irradiation of ultraviolet rays or ionizing radiation, and then, developed by a polar solvent or non-polar solvent. For example, when a high-molecular compound produced by changing a hydroxyl group of polyhydroxylene to a t-butoxycarbonylester is irradiated by an ionizing radiation, the ester coupling is cut. As a result, the exposed part is changed into a hydroxyl group and becomes undissolvable by the non-polar solvent such as toluene. Therefore, such a high-molecular compound is developed by a non-polar solvent, the exposed part remains undissolved so that a negative resist pattern can be formed. Also, since the exposed part is not gelled, the compound is rapidly dissolved by a polar solvent.

On the dissolvable material layer on which the liquid flow pattern is formed in such a way, a resin layer 5 is further formed as shown in FIG. 3. Since this resin becomes a structural material for a liquid jet recording head, there is required the particular characteristics such as a high mechanical strength, heat resistance, adhesiveness to the substrate, resistance to the recording liquid, and a property which will not change the property of the recording liquid. As described earlier, according to the present invention, a high-molecular compound containing a glycidyl methacrylate is used as the covering resin. This resin can be hardened at a low temperature, leading to an advantage that a high-speed etching is possible by the oxygen plasma.

Furthermore, a particular characteristic is required so that the dissolvable resin pattern is not deformed in the process in which the aforesaid resin layer is formed. In other words, it is necessary to use the aforesaid covering resin which scarcely has polarity when the dissolvable resin pattern can be dissolved by a polar solvent, and on other hand, to use a resin having polarity if the dissolvable resin pattern can be dissolved by a non-polar solvent.

Moreover, when the aforesaid covering resin layer is formed by a transfer mold or the like, there is required a resistance to heat good enough to prevent any deformation at the pressing temperature among others.

As the resin to satisfy these characteristics, there can be named a thermal setting resin such as an epoxy resin, saturated polyester resin, diethyl phthalate resin, or the like, and a thermoplastic resin such as a polysulfene, polyester sulfene, polycarbonate, polyester, or the like. As described earlier, a remarkable feature of the present invention is an extremely wide range of selection for the aforesaid coating resin. In other words, it is possible to select an optimal material suitable for the structural material of the liquid jet recording head without any particular provision of the photosensitivity required or, further, any implementation of the high resolution required. The aforesaid covering resin is one of such examples. Fundamentally, for the coating resin according to the present invention it is possible to use any resin materials other than the silicon resin and the resin containing metals which cannot be etched by the application of the oxygen plasma.

As the method for forming the aforesaid resin layer, a solvent coating is applicable as it is if the resin is liquid. Also, if the resin is solid, it should be dissolved into a liquid for the solvent coating or molten by heat for a transfer mold formation. When the covering resin is coated by the solvent coating, the coated solvent is removed by baking and then, treated by a setting reaction. It is preferable to given the setting reaction at a temperature of 50° to 120° C. The setting time depends on the setting temperature to be given, but it may be one to 12 hours. Also, if an onium salt or the like is used, it may be possible to further prevent the positive photoresist from being subsided for the formation of the ink flow passage pattern if an optical setting reaction is Given in advance, and then, the thermal setting is performed.

Subsequently, as shown in FIG. 4, the ink discharging port pattern is formed by a material 6 having a high resistance to the oxygen plasma on the aforesaid covering resin layer 5. As the material having a high resistance to the oxygen plasma, a metal and metal oxide film can be named. A film of the kind is formed on the surface of the foregoing covering resin by a vacuum deposition or sputtering method. Then, by the photolithography technique using a photosensitive resin, the ink discharging port pattern is formed on the layer of the foregoing material. For example, when a positive photoresist is used, the photoresist is coated by means of a spin coating method or the like. Then, after baking, a pattern exposure is given to the ink discharging port pattern, which will be developed and rinsed. Subsequently, with the aforesaid resist as a mask, the metal or metal oxide film is etched by a fluoric plasma or chloric plasma to form the ink discharging port pattern.

Further, as means for forming the ink discharging port pattern easily, the means which uses a silicon resist can be cited. Such resist has a photosensitivity, and the required patterning is executable by the application of the ultraviolet rays, Deep-UV rays or electron rays and X rays, or the like. Also, the aforesaid resist also has a high resistance to the oxygen plasma, making it possible to etch the coating resin layer with the resist pattern as its mask.

As the silicon resists, any one of them can be used if only the resist has a sufficient resistance to the etching by the oxygen plasma which will be described later. For example, chrolomethyl polydiphenyl siloxane (Toso Inc. SNR resist), polydimethyl siloxane, polymethyl silcesquioxane, polyphenyl silcesquioxane, polymethacryl resin containing silicon, or the like are usable.

Subsequently, as shown in FIG. 5, the ink discharging ports 7 are formed on the covering resin by the oxygen plasma with the metal or metal oxide film or the silicon resist film 6 formed on the covering resin layer as a mask. For the etching by the oxygen plasma, a usual plasma etching, sputtering, or the like can be used, but it is most preferably to apply a reactive ion etching (RIE) because not only its etching speed is fast, but also the etching anisotropy is high among others. As the RIE apparatus, it is preferable to use a parallel flat type, magnetron type, or an ECR ion etching apparatus. Also, as the etching condition, it is necessary to optimize the oxygen gas pressure and the application of electric power in order to make the anisotropic etching possible. Since the metal or metal oxide film and the silicon resist are hardly etched in the aforesaid etching operation, it is possible to form a highly precise ink discharging ports. Also, the etching end point can be set at the stage where the etching reaches the dissolvable resin pattern. There is no need for a precise detection of the etching end point. Further, even when the etching residue is generated, there is no significant problem to be encountered because in a method for manufacturing a liquid jet recording head according to the present invention the dissolvable resin pattern is eluted by a solvent for removal in the last state of the process among other remarkable advantages.

Now, in a case where an ionizing radiation decomposable photosensitive resin is used for the formation of the ink passages, the foregoing photosensitive resin is dissolved by the irradiation of the ionizing radiation, and then, the resin elution is given in the next process.

Lastly, as shown in FIG. 6, using a solvent the dissolvable resin which forms the ink passage pattern is eluted. This elution can be executed simply by immersing the substrate into the solvent or by spraying the solvent onto the substrate. Also, if an ultrasonic, or the like is applied together, the time required for the elution will be further shortened.

Now, with respect to the substrate on which the ink flow passages 8 and the ink discharging ports 7 are thus formed, the electrical connection is arranged to drive a member for supplying ink (ink tank) 9 and liquid discharging energy generating elements in order to form a liquid jet recording head as shown in FIG. 7.

The present invention produces an excellent effect on ink jet recording methods, particularly a recording head and a recording apparatus wherein the flying droplets are formed by utilizing thermal energy to perform recording.

Regarding the typical structure and operational principle of such a method, it is preferable to adopt those which can be implemented using the fundamental principle disclosed in the specifications of U.S. Pat. Nos. 4,723,129 and 4,740,796. This method is applicable to the so-called on-demand type recording system and a continuous type recording system. Particularly, however, it is suitable for the on-demand type because the principle is such that at least one driving signal, which provides a rapid temperature rise beyond a departure from nucleation boiling point in response to recording information, is applied to an electrothermal transducer disposed on a liquid (ink) retaining sheet or liquid passage whereby to cause the electrothermal transducer to generate thermal energy to produce film boiling on the thermoactive portion of the recording head; thus effectively leading to the resultant formation of a bubble in the recording liquid (ink) one to one for each of the driving signals. By the development and contraction of the bubble, the liquid (ink) is discharged through a discharging port to produce at least one droplet.

The driving signal is preferably in the form of pulses because the development and contraction of the bubble can be effectuated instantaneously, and, therefore, the liquid (ink) is discharged with quick response. The driving signal in the form of pulses is preferably such as disclosed in the specifications of U.S. Pat. Nos. 4,463,359 and 4,345,262. In this respect, the temperature increasing rate of the heating surface is preferably such as disclosed in the specification of U.S. Pat. No. 4,313,124 for an excellent recording in a better condition.

The structure of the recording head may be as shown in each of the above-mentioned the specifications wherein the structure is arranged to combine the discharging ports, liquid passages, and the electrothermal transducers as disclosed in the above-mentioned patents (linear type liquid passage or right angle liquid passage). Besides, the structure such as disclosed in the specifications of U.S. Pat. Nos. 4,558,333 and 4,459,600 wherein the thermal activation portions are arranged in a curved area is also included in the present invention. In addition, the present invention is applicable to the structure disclosed in Japanese Laid-Open Patent Application No. 59-123670 wherein a common slit is used as the dischrging ports for plural electrothermal transducers, and to the structure disclosed in Japanese Laid-Open Patent Application No. 59-138461 wherein an opening for absorbing pressure wave of the thermal energy is formed corresponding to the discharging ports.

Further, as a full-line type recording head capable of recording over the entire width of a recording sheet at the same time, the present invention can demonstrate the above-mentioned effects more efficiently irrespective of its structure wherein a plurality of the recording heads as disclosed in the above-mentioned specifications are combined to satisfy the required length or a single head which is integrally formed for this particular purpose.

In addition, the present invention is effectively applicable to a replaceable chip type recording head which is connected electrically with the main apparatus and for which the ink is supplied when it is mounted in the main assemble; or to a cartridge type recording head having an ink container integrally provided for the head itself. Also, it is preferable to provide recording head recovery means and preliminarily auxiliary means additionally because these means will contribute to making the effectiveness of the present invention more stabilized. To name them specifically, these are capping means for the recording head, cleaning means, compression or suction means, preliminary heating means such as electrothermal transducers or heating elements other than such transducers or the combination of those types of elements, and the preliminary discharge mode besides the regular discharge for recording.

Further, as the recording mode of the apparatus, the present invention is extremely effective in applying it not only to the recording mode wherein only main color such as black is recorded, but also to an apparatus having at least one of a multi-color mode with ink of different colors, a full-color mode using the mixture of the colors, or a mode using the kinds of ink which are of the same color but have different densities, irrespective of whether the recording head is integrally structured or it is structured by a combination of plural recording heads.

Also, to the recording head obtainable by the present invention, it is possible to apply an ink which is not liquid, but solidified below the room temperature and softened or liquefied at the room temperature or softened or liquefied in the usual temperature control range for ink jet recording which is not lower than 30° C. but not higher than 70° C. In other words, it will suffice if only the ink can be liquefied when the recording signals are applied. In addition, while positively preventing the temperature rise due to the thermal energy by the use of such energy as an energy consumed for changing states of ink from solid to liquid, or using the ink which will be solidified when left intact for the purpose of preventing ink evaporation, it may be possible to apply to the present invention, the use of an ink having a nature of being liquefied only by the application of thermal energy such as an ink capable of being discarged as ink liquid by enabling itself to be liquefied anyway when the thermal energy is given in accordance with recording signals, an ink which will have already begun solidifying itself by the time it reaches a recording medium.

For an ink such as this, it may be possible to retain the ink as a liquid or solid material in through holes or recesses formed in a porous sheet as disclosed in Japanese Laid-Open Patent Application No. 54-56847 or Japanese Laid-Open Patent Application No. 60-71260 in order to execute a mode whereby to enable the ink to face the electrothermal transducers in such a state. In the present invention, the most effective method for the respective ink mentioned above is the one which is capable of implementing the film boiling method described above.

FIG. 8 is a perspective view showing the outer appearance of an example of the ink jet recording apparatus (IJRA) to which a liquid jet recording head obtainable by the present invention is bonded as an ink jet cartridge (IJC).

In FIG. 8, a reference numeral 20 designates an ink jet cartridge (IJC) provided with the nozzle group which discharges ink onto the recording surface of a recording sheet fed on a platen 24; and 26, a carriage HC holding the IJC 20, which is partly coupled to a driving belt 18 transmitting the driving force of a driving motor 17, and slidably mounted on the two guide shafts 19A and 19B arranged in parallel, thus enabling the IJC 20 to reciprocate along the entire width of the recording sheet.

A reference numeral 26 is a head recovery device which is arranged at one end of the traveling passage of the IJC 20, that is, a location opposite to its home position, for example. The head recovery device 26 is driven by the driving force of a motor 22 through a transmission mechanism 23 in order to cap the IJC 20. Interlocked with the capping operation for the IJC 20 by a cap unit 26A of this head recovery device 26, an ink suction is executed by an appropriate suction means provided in the head recovery device 16 or the pressurized ink feeding is actuated by an appropriate pressure means provided in the ink supply passage to the IJC 20. Thus, the ink is forcibly exhausted from the discharging ports to execute a discharge recovery process such as the removal of any overly viscous ink in the nozzles. Also, when the recording operation is terminated, the capping is performed to protect the IJC 20.

A reference numeral 30 designates a wiping blade made of a silicon rubber, which is arranged at the side end of the head recovery device 26. The blade 30 is held by a blade holding member 30A in a cantilever fashion, and is driven by the motor 22 and the transmission mechanism 23 in the same manner as in the head recovery device 26; hence enabling it to engage with the discharging surface of the IJC 20. In this way, the blade 30 is allowed to extrude in the traveling passage of the IJC 20 at an appropriate timing during the-recording operation of the IJC 20 or subsequent to the discharging recovery process using the head recovery device 26 in order to wipe the dews, wets, or dust particles on the discharging surface of the IJC 20 along the traveling of the IJC 20.

DETAILED DESCRIPTION OF THE PREFERRED EMBODIMENTS

Hereinafter, the description will be made of the embodiments according to the present invention further in detail.

Embodiment 1

Figure 5:
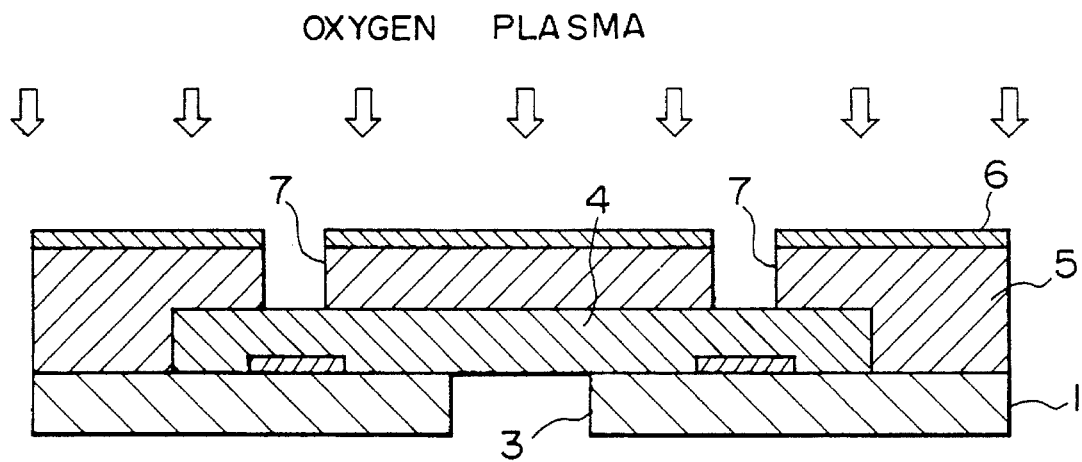
FIG. 5 is a cross-sectional view illustrating a substrate wherein ink discharging ports are formed by the oxygen plasma on the covering resin.
Figure 6:
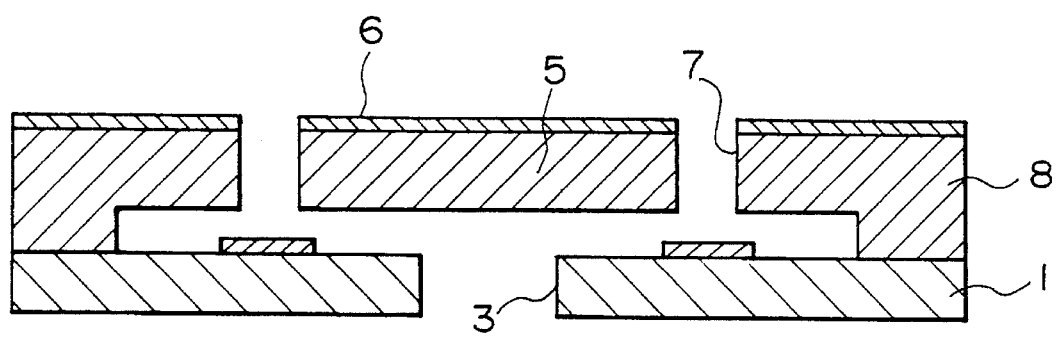
FIG. 6 is a cross-sectional view illustrating a substrate wherein the dissolvable resin pattern is eluted.
Figure 7:
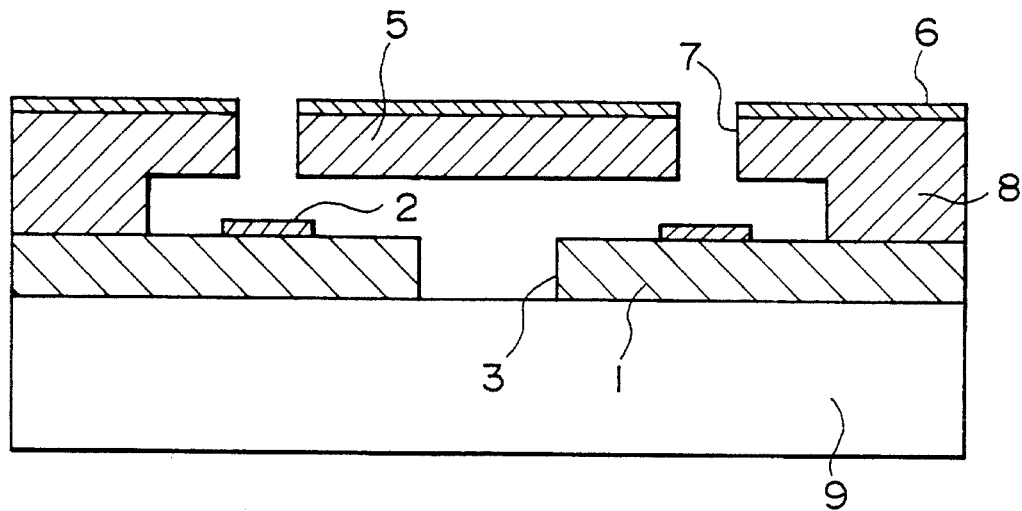
FIG. 7 is a cross-sectional view illustrating a head provided with an ink supply means.
Figure 8:
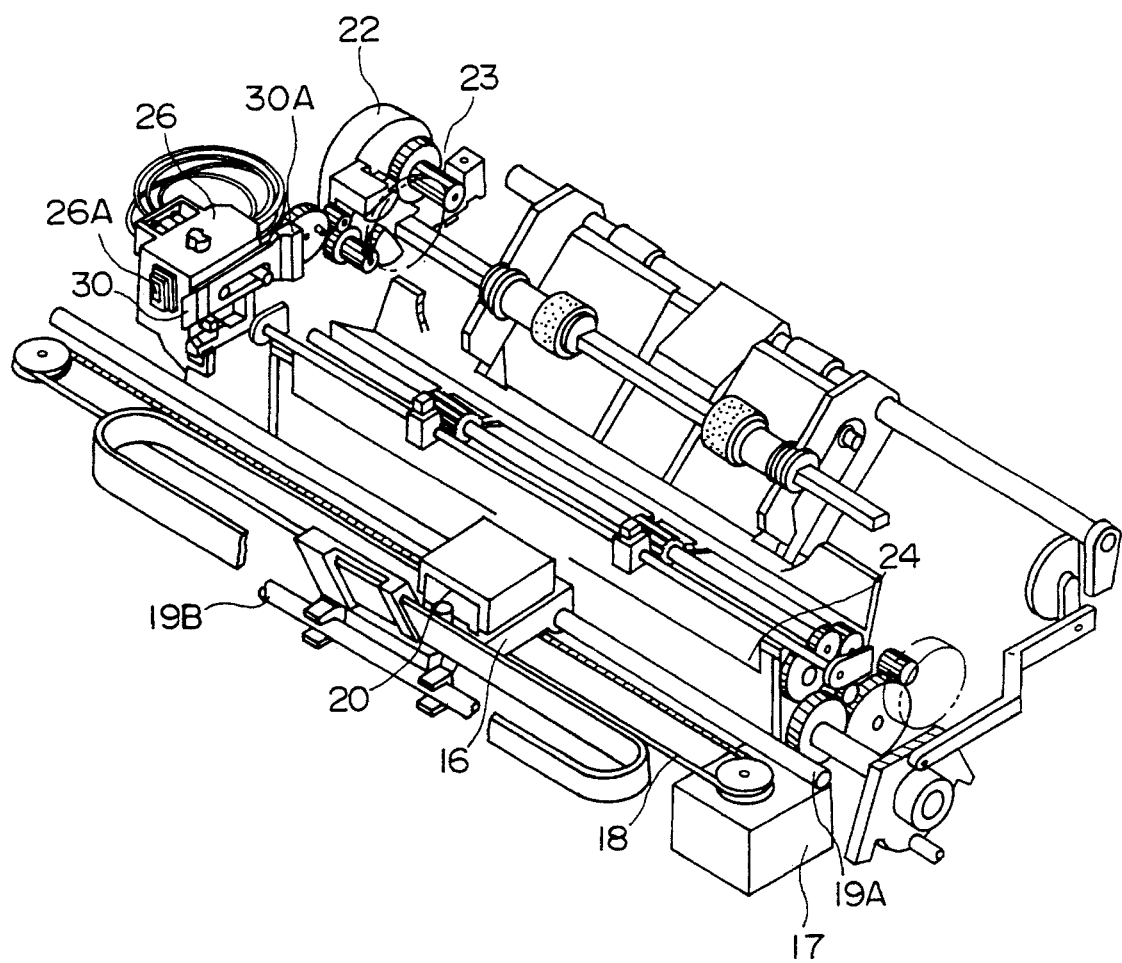
FIG. 8 is a perspective view illustrating one mode of a recording apparatus using a liquid jet recording head according to the present invention.

In accordance with the operational procedures shown in FIG. 1 to FIG. 7, a liquid jet recording head having a structure shown in FIG. 7 is manufactured.

Figure 1:
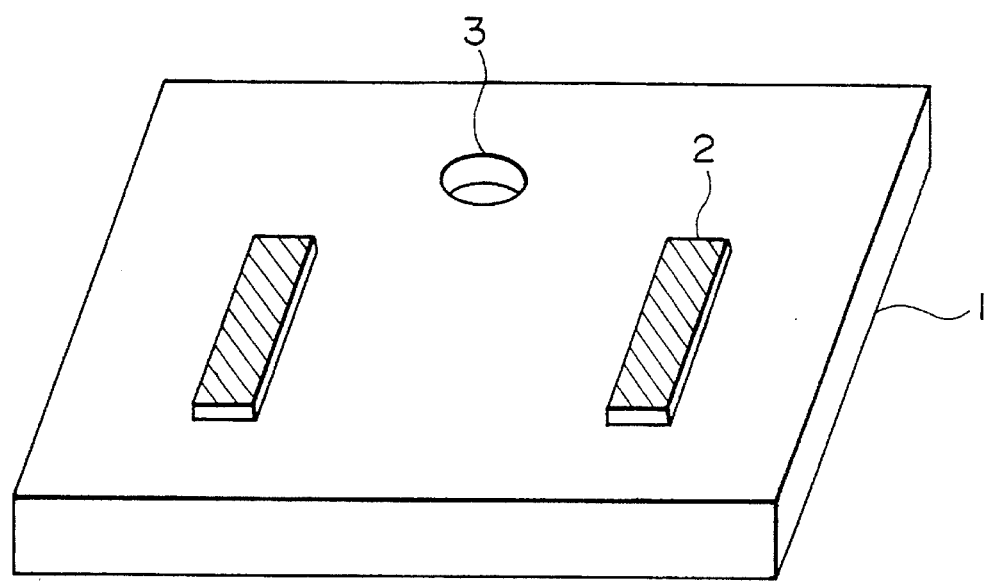
FIG. 1 is a perspective view schematically illustrating a substrate before the formation of ink flow passages and orifices.
Figure 2:
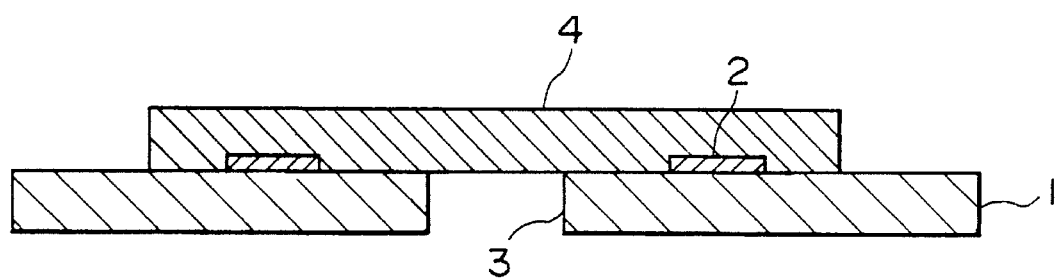
FIG. 2 is a cross-sectional view illustrating a substrate on which a dissolvable ink passage pattern is formed.

At first, as shown in FIG. 1, a through hole 3 for supplying ink is opened by means of a drill on a glass substrate 1 having electrothermal transducers (heaters made of HfB2) formed as liquid discharging energy generating elements 2 thereon. Then, as shown in FIG. 2, an OZATEC R-255 (Hexist Inc.) is laminated on the aforesaid substrate as a positive dry film to form ink flow passages 4. This resist is a mixture of a novolac resin and a dissolution-inhibiting agent, and the pattern thus formed is easily eluted by an alkali solution, alcohol, ketone and ester, or the like for removal. The coated resist is prebaked for 20 minutes at 110° C., and then, is pattern exposed by the Canon mask aligner PLA-501FA for the ink flow passage pattern. The exposure is 50 counts, and for the development, a developer MIF-312 (Hexist Inc.) is used by diluting it double with a deionized water. The film thickness of the aforesaid ink flow passage pattern is 25 µm.

The aforesaid resist pattern is the one with which to secure the ink flow passages for the ink supply inlet 3 and the electrothermal transducers. The resist pattern is left intact where the aforesaid flow passages are to be formed.

Figure 3:
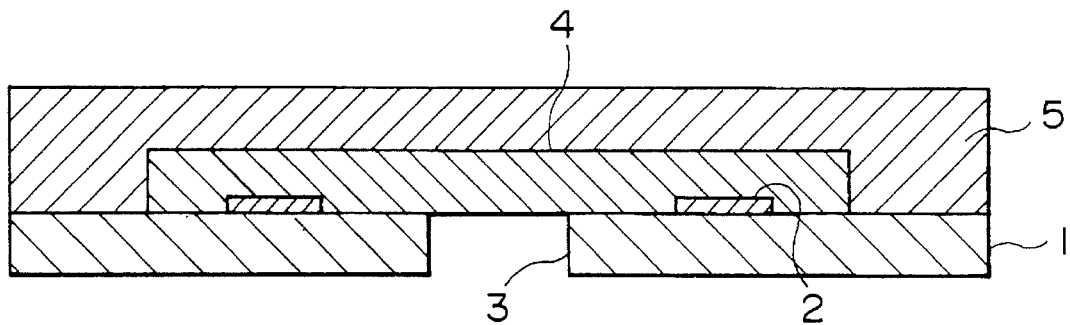
FIG. 3 is a cross-sectional view illustrating a substrate on which a coating resin is formed.

Then, as shown in FIG. 3, on the aforesaid resist film, a resin 5 is deposited. For the covering resin, a copolymer of glycidyl methacrylate and methylmethacrylate in a ratio of 20:80 is used. A mixture of the foregoing resin and triethylene tetramine serving as a setting agent produced in a ratio of 98% and 2% is dissolved in a chlorobenzene having a density of 20 wt % for use. The resin is coated by a spinner and then baked as it is for 2 hours at 80° C. to set the covering resin. The film thickness of this covering resin is 35 µm. Also, this covering resin is not equally dissolved with the positive resist material. Therefore, it is possible to set the covering resin without inviting any deformation of the ink flow passage pattern.

Figure 4:
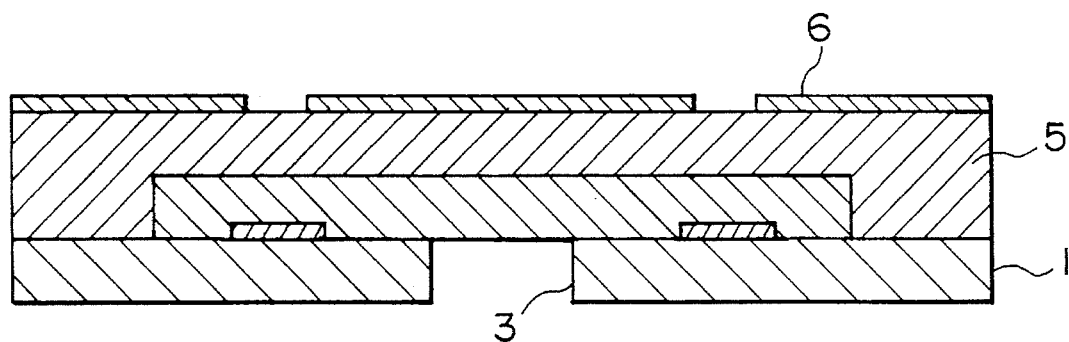
FIG. 4 is a cross-sectional view illustrating a substrate wherein an ink discharging port pattern is formed by a material having a high resistance to the oxygen plasma on the covering resin layer.

Subsequently, as shown in FIG. 4, on the foregoing setting resin film 5, the ink discharging port pattern is formed. This pattern serves as a mask for the oxygen plasma etching. The formation of the etching mask is made in the following means:

At first, on the hardened covering resin layer, a silicon oxide film 6 is formed by the application of a sputtering method. The sputtering apparatus used is SPH-530H (Nichiden-Anelva Inc.). It takes 30 minutes to form the film under argon gas pressure of 0.001 Torr with an applied RF power of 1 kW. The film thickness of the aforesaid film is 0.2 µm.

On the aforesaid silicon oxide film, the positive photoresist OFPR-800 (Tokyo Ohka Inc.) is coated, and baked for 20 minutes at 90° C. Then, the ink discharging ports are patterned by the use of Canon mask aligner PLA-501. The exposure is 20 counts. Then, the pattern is developed by the application of NMD-3 developer (Tokyo Ohka Inc.) and rinsed with a deionized water. After the development, the substrate is mounted on the parallel flat type dry etching apparatus DEM-451 (Nichiden-Anelva Inc.) for etching by a mixture of 4-fluoric gas and 5% oxygen gas to form the ink, discharging port pattern on the silicon oxide film. The etching gas pressure is 10 Pa and the applied power is 150 W. The etching period required is two minutes.

Then, as shown in FIG. 5, the ink discharging ports 7 are formed on the covering resin layer. The oxygen gas is used for etching. The etching gas pressure is 8 Pa and the applied power is 150 W. Under such condition, the etching period required is 30 minutes. The etching speed for the aforesaid covering resin layer is 0.8 µm/min. This etching is four times faster than the case where a bisphenol A epoxy resin is used.

Then, as shown in FIG. 6, the positive photosensitive resin is eluted to form the ink flow passages 8. The substrate is immersed in a 5 wt % sodium hydroxide aqueous solution, and while providing an ultrasonic wave, the positive photoresist forming the ink flow passage pattern is eluted for removal.

Lastly, as shown in FIG. 7, the substrate is bonded to the ink tank 9 in an arrangement so that ink is supplied from the ink supply inlet, and then, the electrical assembly is made for the provision of electrical signals, thus completing a liquid jet recording head.

The liquid jet recording head thus manufactured is installed in a recording apparatus for recording. The ink used is composed of a pure water/glycerol/direct black 154 (water soluble black dye)=65/30/5. A stable printing is possible.

Embodiment 2

On a substrate manufactured in the same manner as the Embodiment 1, an ink flow passage pattern is formed by a positive photoresist, a covering resin layer is coated and hardened, a silicon oxide film is formed, and an ink discharging port pattern is formed.

The specimen thus obtained is mounted on the magnetron etching apparatus (Nippon MRC, Inc.). The covering resin layer is etched by the oxygen plasma. The etching condition is: the applied power is 2 kW, oxygen gas pressure is 5 mTorr, gas flow rate is 50 ccm. The etching speed for the aforesaid film is 6 μm/min. The etching is performed for two minutes to form the ink discharging ports.

Subsequently, in the same manner as the Embodiment 1, the electrical assembly is made to install an ink tank after the positive photoresist is eluted.

When the printing is executed in the same manner as the Embodiment 1, an excellent printing is obtained.

Embodiment 3

In the same manner as the Embodiment 1, a positive dry film is laminated to the substrate where the electrothermal transducers and ink discharging ports are formed. Then, by the application of the photolithography technique, an ink flow passage pattern is formed. On the aforesaid pattern, a copolymer of a glycidyl methacrylate and methylmethacrylate is coated. Then, a heat setting reaction is given.

Subsequently, an SNR: M-2 (Tosoh, Inc.) is coated by a spin coating as the silicon negative resist. The prebaking is performed for 20 minutes at 80° C. Then, using the Canon ultraviolet mask aligner PLA-520, an exposure is given for the counts 10. The ink discharging port pattern is formed after the development and rinse with a dedicated developer and rinsing agent. Subsequently, in the same manner as the Embodiment 2, the substrate is mounted on the magnetron RIE apparatus (Nippon MRC, Inc.) and is etched in the same condition as the Embodiment 2. Lastly, the positive photoresist forming the ink flow passage pattern is eluted. The electrical assembly as well as the boding to an ink tank is processed. Thus, in the same manner as in the Embodiment 1, the printing is executed with an excellent result.

Embodiment 4

In the same manner as the Embodiment 1, electro-thermal transducers and ink discharging ports are formed on a substrate. Then, a positive dry film is laminated to form an ink passage pattern. Subsequently, copolymers of methacrylate and glycidyl methacrylate are prepared in various copolymerization ratios and deposited to compare the setting properties thereof. In this respect, the syntheses of these copolymers are executed in the method given below.

A methylmethacrylate and glycidyl methacrylate are mixed in a given mole ratio. With the tetrahydrofuran in an amount of 1.5 times such mixture as a solvent, an 0.5 mol % azobisisobutylnitrile is added as an initiation agent to the monomer which is distilled by a reduced distillation method. The monomer is copolymerized as it is for six hours at 60° C. Then, the resin is collected by giving an reaction solution to the cyclohexene, which is again dissolved into the tetrahydrofuran and precipitated by the cyclohexene for rinsing the resin. The resin is collected as it is over two days as specimen. To this resin, a triethylentetramine is added in an amount equal to the epoxy group and dissolved in the chrolbenzene in a density of 20 wt %. The resin film thus prepared is hardened for six hours at 80° C. Subsequently, these specimens are placed in an electric oven at 150° C. for the observation of the film state.

As a result, it is found that the coating resin the copolymerization ratio of which to the glycidyl methacrylate is 5 mol % or less allows its resin to be softened at a temperature of 150° C., leading to the occurrence of subsidence on the ink supply inlet. Here, any covering resin having the copolymerization of 10 mol % or more does not allow any subsidence to occur. Further, it is observed that when the copolymerization exceeds 55 mol %, the resin layer is peeled off from the substrate.

After this experiment, it is determined that the copolymerization ratio to the glycidyl methacrylate should preferably stay within a range of 10 to 50 mol %.

Embodiment 5

In the same manner as the Embodiment 1, a positive dry film is laminated on the substrate where electro-thermal transducers and ink supply inlet are formed. Also, in the same manner as the Embodiment 1, the ink flow passage pattern is formed. Then, a 1.5 wt % onium salt (SP-170: Adeka Inc.) is added to the copolymer of a glycidyl methacrylate and methylmethacrylate of 20:80 (mol), and a solvent dissolved in a chlorbenzene in a density of 20% is coated by a spin coating method. Then, in a period of one hour required, the solvent is removed at 60° C. This film is mounted on the Canon mask aligner PLA-501 for a 20-minute exposure. Then, it is baked for 30 minutes at 60° C. Subsequently, in a period of one hour required, the covering resin layer is completely hardened by heating at 120° C.

In the same manner as the Embodiment 3, a silicon negative resist SNR is coated, exposed, and developed to form the ink discharging pattern. Then under the same condition as the Embodiment 3, the covering resin layer is etched by the magnetron etching apparatus (Nippon MRC, Inc.).

In the same manner as the Embodiment 1, the positive photoresist forming the ink flow passage pattern is eluted, and the electrical assembly and the installation to the ink tank are executed. In the same manner as the Embodiment 1, the printing is performed. An excellent printing is obtained.

Embodiment 6

On the substrate manufactured in the same manner as the Embodiment 1, the ink flow passage pattern is formed by a positive dry film, and the covering resin layer is coated and settled as in the Embodiment 1.

Then, a silicon negative resist (Tosoh: SNR-M-2) is coated by a spin coating method. A prebake is given to it for 20 minutes at 80° C. The film thickness of this silicon resist is 0.6 μm. The aforesaid substrate is mounted on the Canon mask aligner PLA-520, and using a cold mirror 250, a 10-count exposure is provided. Then, the development is given by a dedicated developer.

In the same manner as the Embodiment 1, the ink discharging port mask pattern formed on the foregoing silicon resist is transferred to the covering resin layer. The oxygen plasma etching condition is that the gas pressure is 8 Pa, applied power is 100 W, and a period of etching is 60 minutes.

Then, the positive resist is eluted by a 5 wt % sodium hydroxide aqueous solution for removal.

As in the Embodiment 1, an ink supply member is bonded to the ink supply inlet to manufacture a liquid jet recording head. The liquid jet recording head thus manufactured is installed in a recording apparatus. When a recording is made using an ink which is composed of a pure water/glycerol/ direct black 154 (water soluble black dye)=65/30/5, a stable printing is possible.

Embodiment 7

On the substrate manufactured in the same manner as the Embodiment 1, the ink flow passage pattern is formed by a positive dry film. Then, the coating resin layer is coated and settled.

On the aforesaid coating resin layer, a silicon negative resist is coated as in the Embodiment 2 for the patterning to be executed.

Then, the foregoing substrate is mounted on the magnetron etching apparatus (Nippon RC Inc.) to etch the covering resin layer by the application of the oxygen plasma. The etching condition is that the applied power is 2 kW, oxygen gas pressure, 5 mTorr, and gas flow rate, 50 ccm. The etching speed for the aforesaid film is 1.5 μm/min. The ink discharging ports are formed in a period of 7 minutes required.

Subsequently, as in the Embodiment 1, the positive photoresist is eluted by a solvent prepared by mixing a 5 wt % sodium hydroxide aqueous solution and ethylalcohol in a ratio of 9 to 1 while applying an ultrasound wave in a period of 5 minutes required. In the same manner as the Embodiment 1, an ink tank is installed in order to observe the discharging characteristics; thus obtaining an excellent printing.

Embodiment 8

At first, on the silicon substrate 1 where electrothermal transducers (heater made of HfB2) is formed as the liquid discharging energy generating elements 2, an ink supply inlet 3 is provided by the application of an YAG laser (FIG. 1). On this substrate 1, a dry film prepared by coating a polymethyl isopropenyl ketone (Tokyo Ohka Inc.: ODUR-1010) on a PET is transferred by lamination (at a temperature of 130° C.) as the ionizing radiation decomposable photosensitive resin layer 4 (see FIG. 2). Here, since the ODUR-1010 has a low viscosity, it is impossible to form any thick film. Therefore, it is used by condensation. Then, after a prebaking for 20 minutes at 120° C., the ink flow passage pattern is exposed by the use of the Canon mask aligner PLA-520FA (using its cold mirror—CM-290). The exposure time is one minutes, and for the development, a metylisobutyl ketone/xylene=2/1 wt is used, and for the rinsing, a xylene is used. The aforesaid resist pattern 4 is to secure the ink flow passages between the ink supply inlet 3 and the electrothermal transducers 2. Thus, the resist pattern is left intact on the location where the flow passages are provided. In this respect, the film thickness of the resist after the development is 10 μm.

Then, the mixture of a copolymer of a methylmethacrylate and glycidyl methacrylate (copolymerization ratio 4/1 and the weight average molecular amount, approximately 200,000 [in terms of the polystyrene]) and a diethylene tetramine (equivalent to an amount of active amine [—NH] to the epoxy group in the aforesaid copolymer) is used on the aforesaid resist pattern 4 as the coating resin 5 (see FIG. 3). The aforesaid mixture is dissolved in a solvent of a toluene/cyclohexanone=9/1 (wt %) in 21 wt %. The coating is provided by a spinner and is hardened for two hours at 100° C. as it is. The film thickness of this coating resin layer is 10 μm after setting on the ink flow passage pattern 4. Also, in forming this covering resin layer, there is no deformation at all for the ink flow passage pattern 4 comprising the ionizing radiation decomposable photosensitive resin layer.

Then, on the aforesaid covering resin layer 5, a silicon negative photoresist (Tosoh Inc.: SNR-M2) 6 is coated in a film thickness of 0.6 μm (FIG. 4), and prebaked for 20 minutes at 80° C. A mask corresponding to the ink discharging port pattern is overlaid on this silicon resist layer, and an exposure is provided. For the exposure, the PLA-520FA (cold mirror CM-250) is used for 20 seconds, and for the development, a propyleneglycol-α-monomethylether/di-n-butylether=5/2 (volume ratio) is used. For the rinsing, a propyleneglycol-α-monometylether/di-n-butylether=1/1 (volume ratio) is used. This silicon resist is a negative resist. Therefore, the ink discharging port pattern is formed in extraction, presenting a problem in forming a fine pattern, but the resist film thickness being thin, it is possible to form a pattern of approximately 2 μm diameter. Here, in the present embodiment, the discharging port pattern of 25 μm diameter is formed.

Subsequently, the aforesaid substrate 1 is introduced into the parallel flat dry etching apparatus (Anelba Inc.: DEM-451). The covering resin layer 5 is etched by the oxygen plasma (FIG. 5). The oxygen gas pressure is 8 Pa, applied power is 150 W/cm$^2$, and etching time is 30 minutes. The etching speed for the covering resin 5 is 0.4 μm/min under the foregoing etching condition. With the 30-minute etching, the penetration of the ink discharging ports 7 is completed. In this respect, by changing the oxygen gas pressures and applied powers, it is possible to vary the degree of the etching anisotropy. Thus, the configuration of the ink discharging ports 7 in the depth direction can be controlled. Also, in the magnetron etching apparatus, it is possible to make the etching speed faster still.

Then, in order to dissolve the aforesaid ionizing radiation decomposable photosensitive resin layer 4, a two-minute exposure is provided by the PLA-520 (using the cold mirror—CM 290). Subsequently, the ionizing radiation decomposable photosensitive resin layer 4 is immersed in a mixture of metylisobutyl ketone/xylene=2/1 (weight %) for rinsing while providing an ultrasonic wave for 15 seconds. Thus, the ink flow passages 8 are formed (FIG. 6). The ionizing radiation decomposable photosensitive resin layer 4 is already exposed and dissolved. Therefore, the rinsing is easy. In this respect, although the copolymer used for the covering resin 5 is of a type such as decomposable by an ionizing radiation, the dissolving reaction can be ignored substantially because the bridge by an amine setting agent has already progressed.

Lastly, as shown in Fig. 7, an ink supplying member 9 is bonded to the ink supply inlet 3 to form an ink jet recording head.

The liquid jet recording head thus manufactured is installed in a recording apparatus to execute a printing by use of an ink which is composed of a pure water/glycerol/direct black 154 (water soluble black dye)=65/30/5 wt. A stable printing is possible. The resultant recording is also of a high quality.

Embodiment 9

On the substrate 1 which is manufactured in the same manner as the Embodiment 8, a dry film prepared by coating a diacetone alcohol solution (20 wt %) of a copolymer of a methylmethacrylate/methacryl acid (copolymerization ratio 8/2, and weight average molecular amount, 150,000) on an aramid film is transferred by lamination (temperature 120° C.) for the formation of an ionizing radiation decomposable photosensitive resin layer. After the prebaking for 20 minutes at 120° C., an exposure is provided in order to form an ink flow pattern. For the exposure, the 2 kW Deep-UV light source (Ushio Denki, Inc.) is employed to provide it for 10 minutes. Then, using a methylisobutyl ketone, the development is executed. The film thickness after the development is 12 μm.

Subsequently, as in the Embodiment 8, the covering resin layer 5 is formed (in 10 μm on the ink flow passage pattern), a silicon resist layer is formed, and then, an etching is provided. After the etching, the aforesaid Deep-UV light source is applied to give a 10-minute exposure. Then, while providing an ultrasonic wave, the development is executed by a methylisobutyl ketone. The ink flow pattern 4 is rinsed. The head thus obtained is evaluated as in the Embodiment 1 with the result that a stable printing is possible and the resultant recording is also of a high quality.

Embodiment 10

On the substrate 1 which is manufactured in the same manner as the Embodiment 8, a dry film prepared by coating a cyclohexanone solution (25 wt %) of a copolymer of methyl methacrylate/phenylisopropenyl ketone (copolymerization ratio 7/3 and weight average molecular amount, 150,000) on a PET film is transferred by lamination (temperature 130° C.) to form an ionizing radiation decomposable photosensitive resin layer. After the prebaking for 10 minutes at 130° C., an exposure is provided to form an ink flow passage pattern. For the exposure, the PLA-520FA (using its cold mirror—CM290) is used for 1.5 minutes. The development is executed by a methylisobutyl ketone/xylene=1/1 and the rinsing, by a xylene. The film thickness after the development was 17 μm.

On the ionizing radiation decomposable photosensitive resin layer 4, a resin layer is formed as the covering resin layer by coating a solvent by a spinner. This solvent is prepared by arranging a mixture of an epoxy resin (bisphenol A: Yuka-Shell Inc.: epicoat 1002), propylene oxide modified bisphenol A. An epoxy resin (Kyouei Inc.: epolite 3002), and a diethylene tetramine as a setting agent in a ratio of 75/22/3, which is dissolved in a 20 wt % mixed solution of a toluene/cyclohexanone=9/1. The covering resin layer thus formed is left as it is for three hours at 100° C. for setting. Here, the film thickness of the covering resin layer is 15 μm on the ink flow passage pattern.

Then, in order to dissolve the ionizing radiation decomposable photosensitive resin 4, a two-minute exposure is provided by the use of the PLA 520 FA (cold mirror—CM290).

Subsequently, in the same manner as the Embodiment 8, a silicon resist is formed for etching. However, the etching condition is that the oxygen gas pressure is 8 Pa, applied power is 200 W/cm², and etching time is one hour. Lastly, the ionizing radiation decomposable photosensitive resin layer 4 is rinsed by immersing it in a solution of a methylisobutyl ketone while providing an ultrasonic wave.

The head thus manufactured is evaluated in the same manner as the Embodiment 1 with the result that a stable printing is possible and the resultant recording is also of a high quality.

As the effects produced by the present invention as described above, the items listed below can be cited.

1) It is possible to control rigidly the distance between the ink discharging pressure generating elements and the orifices because the ink discharging ports are formed without cutting the substrate. As a result, a liquid jet recording apparatus can be manufactured with the stabilized discharging characteristics.

2) The process is simpler because no cutting process is required for the provision of the orifice surface.

3) Since the positioning of the main structural material layer is executed by the photolithography technique, it is possible to execute it simply and accurately so that the head can be manufactured with a high dimensional precision in an excellent yield.

4) It is possible to form the ink discharging ports with a high resolution enabling them to be reproduced in an excellent condition and at the same time, to allow a liquid jet recording head to be manufactured with a desirable mechanical strength as well as resistance to heat and ink.

5) With a simple means, a high density, multi-array liquid jet recording head can be obtained.

6) It is possible to simply and accurately modify the height of the ink flow passages and the length of the orifice portion for control by the film thickness of the resist film to be coated. Therefore, the design modification and control can be implement easily.

7) There is no need for bonding minute portions by the application of any adhesives. As a result, there is no possibility that the adhesives clog the ink flow passages and orifice portion. The reduction of the head functions will not be invited.

8) Since the discharging port surface is covered by a silicon resin, it is difficult for the ink which contains water to adhere thereto. Thus, it is possible to manufacture a liquid jet recording head capable of discharging ink droplets with an excellent linear flight.

9) Using the vinyl high-molecular compound for which a glycidyl methacrylate is copolymerized, it is possible to harden the covering resin layer at a low temperature without any adverse effect produced on the resin forming the ink flow passage pattern (thermal setting, deformation, or the like).

10) The speed of the oxygen etching is extremely fast on the acrylic high-molecular compounds for which a glycidyl methacrylate is copolymerized, leading to the improvement of the productivity of liquid jet recording heads.

11) The main process for the formation of the head is executed by the application of the lithography technique using a photoresist or photosensitive dry film; hence making it possible to easily form the minute portions of the head with a desired pattern and at the same time, to process many numbers of the heads having the same structure simultaneously.

What is claimed is:

1. A method for manufacturing a liquid jet recording head, including the following:

a first process of forming an ink flow passage pattern on a substrate by a dissolvable resin layer;

a second process of forming a covering resin layer on said ink flow passage pattern;

a third process of forming an ink discharging port pattern by a material having resistance to an oxygen plasma on the surface of said covering resin layer;

a fourth process of forming ink discharging ports by dry etching the covering resin layer by the application of the oxygen plasma with said discharging port pattern as a mask; and a fifth process of eluting said dissolvable resin layer.

2. A method for manufacturing a liquid jet recording head according to claim 1, wherein the dissolvable resin layer is an ionizing radiation decomposable photosensitive resin layer, and said method includes a process of executing a dissolution by irradiating an ionizing radiation of said photosensitive resin layer in either one of the processes between said second process and fifth process.

3. A method for manufacturing a liquid jet recording head according to claim 1, wherein the dissolvable resin layer is a positive resist.

4. A method for manufacturing a liquid jet recording head according to claim 1, wherein the dissolvable resin is an ionizing radiation decomposable photosensitive resin layer and the covering resin layer is a vinyl high-molecular compound including at least a glycidyl methacrylate.

5. A method for manufacturing a liquid jet recording head according to claim 4, wherein the copolymerization ratio of the glycidyl methacrylate is 10 to 50 mol %.

6. A method for manufacturing a liquid jet recording head according to claim 1, wherein the setting agent for the covering resin is an amine setting agent.

7. A method for manufacturing a liquid jet recording head according to claim 1, wherein the setting agent for the covering resin is an onium salt, and the covering resin is hardened by an optical setting reaction.

8. A method for manufacturing a liquid jet recording head according to claim 2, wherein the ionizing radiation decomposable photosensitive resin includes a unit represented at least by the general formula (1):

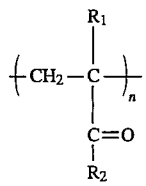
(1)

(where $R_1$ represents a hydrogen atom and an alkyl group, and $R_2$, an alkyl group, replaced and non-replaced aromatic ring, and heterocyclic ring in the formula).

9. A method for manufacturing a liquid jet recording head according to claim 2, wherein the ionizing radiation decomposable photosensitive resin includes a unit represented at least by the general formula (2):

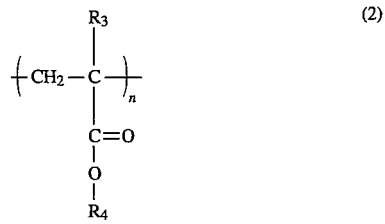
(2)

(where $R_3$ represents an alkyl group and halogen atom, and $R_4$, an alkyl group, replaced and non-replaced aromatic ring, and heterocyclic ring in the formula).

10. A method for manufacturing a liquid jet recording head according to claim 2, wherein the ionizing radiation decomposable photosensitive resin is a polysulfone.

11. A method for manufacturing a liquid jet recording head according to claim 1, wherein the material having a high resistance to the oxygen plasma is a silicon resist.

12. A method for forming an ink discharge port pattern by an oxygen plasma-resistive material on a plate formed of resin material and forming ink discharging ports by dry etching the plate by application of the oxygen plasma with said ink discharge port as a mask, wherein said oxygen plasma-resistive material is a silicon resist.

* * * * *

UNITED STATES PATENT AND TRADEMARK OFFICE
CERTIFICATE OF CORRECTION

PATENT NO. : 5,458,254

DATED : October 17, 1995

INVENTOR(S) : MASASHI MIYAGAWA, ET AL.

It is certified that error appears in the above-indentified patent and that said Letters Patent is hereby corrected as shown below:

COLUMN 3

Line 40, "ease" should read --easy--.

COLUMN 5

Line 18, "film" should read --films--.

Line 45, "glycizil" should read --glycidyl--.

COLUMN 6

Line 32, "such a" should read --such as--.

COLUMN 8

Line 9, "is" should be deleted.

Line 27, "represnets" should read --represents".

UNITED STATES PATENT AND TRADEMARK OFFICE
CERTIFICATE OF CORRECTION

PATENT NO. : 5,458,254
DATED : October 17, 1995
INVENTOR(S) : MASASHI MIYAGAWA, ET AL.

It is certified that error appears in the above-indentified patent and that said Letters Patent is hereby corrected as shown below:

COLUMN 10

Line 5, "an" should read --a--.

Line 13, "materials" should read --material--.

COLUMN 11

Line 32, "given" should read --give--.

Line 38, "Given" should read --given--.

COLUMN 12

Line 1, "chrolomethyl" should read --chloromethyl--.

Line 20, "ports" should read --port.--.

Line 39, "an ultrasonic," should read --ultrasonic agitation,--.

UNITED STATES PATENT AND TRADEMARK OFFICE
CERTIFICATE OF CORRECTION

PATENT NO. : 5,458,254
DATED : October 17, 1995
INVENTOR(S) : MASASHI MIYAGAWA, ET AL.

It is certified that error appears in the above-indentified patent and that said Letters Patent is hereby corrected as shown below:

COLUMN 13

Line 15, "the" (2nd occurrence) should be deleted.

Line 19, "passage)." should read --passage).--.

Line 26, "dischrging" should read --discharging--.

Line 42, "assemble;" should read --assembly;--.

COLUMN 14

Line 13, "discarged" should read --discharged--.

Line 66, "the-recording" should read -- the recording--.

COLUMN 16

Line 30, "ink," should read --ink--.

COLUMN 17

Line 25, "rinse" should read --rinsed--.

Line 31, "boding" should read --bonding--.

UNITED STATES PATENT AND TRADEMARK OFFICE
CERTIFICATE OF CORRECTION

PATENT NO. : 5,458,254
DATED : October 17, 1995
INVENTOR(S) : MASASHI MIYAGAWA, ET AL.

It is certified that error appears in the above-indentified patent and that said Letters Patent is hereby corrected as shown below:

Line 50, "an" should read --a--.

Line 56, "chrolbenzene" should read --chlorobenzene--.

COLUMN 19

Line 31, "an" should read --a--.

Line 42, "minutes," should read --minute,--.

COLUMN 20

Line 8, "propyleneglycol-α-monometylether/" should read --propyleneglycol-α-monomethylether/--.

Line 35, "metylisobutyl" should read --methylisobutyl--.

COLUMN 22

Line 19, "implement" should read --implemented--.

Signed and Sealed this

Fourteenth Day of May, 1996

Attest:

BRUCE LEHMAN

*Attesting Officer*     *Commissioner of Patents and Trademarks*